(12) United States Patent
Shah

(10) Patent No.: US 6,173,164 B1
(45) Date of Patent: Jan. 9, 2001

(54) METHOD AND APPARATUS FOR WIDE RANGE AUTOMATIC FREQUENCY CONTROL

(75) Inventor: Abhijit A. Shah, Sunnyvale, CA (US)

(73) Assignee: Wireless Access, Santa Clara, CA (US)

( * ) Notice: Under 35 U.S.C. 154(b), the term of this patent shall be extended for 0 days.

(21) Appl. No.: 08/932,805

(22) Filed: Sep. 15, 1997

(51) Int. Cl.[7] .................................................. H04B 1/18
(52) U.S. Cl. .................................. 455/182.1; 455/191.1; 348/735; 375/344
(58) Field of Search .............................. 455/180, 182.1, 455/182.2, 188, 192, 192.2, 553, 38.1, 38.2; 340/825.44; 348/735, 732; 375/344, 239

(56) References Cited

U.S. PATENT DOCUMENTS

| | | | |
|---|---|---|---|
| 4,077,009 | * | 2/1978 | Klank et al. ........................ 325/455 |
| 4,330,867 | * | 5/1982 | Fujita ................................. 455/186 |
| 4,737,993 | * | 4/1988 | DeVilbiss ........................... 455/180 |
| 5,303,398 | * | 4/1994 | Tults ................................... 455/182.1 |
| 5,552,838 | * | 9/1996 | Suizu ................................. 348/735 |
| 5,850,186 | * | 12/1998 | Min .................................. 340/825.44 |

OTHER PUBLICATIONS

Analysis and Design of Analog Integrated Circuits, P. Gray, et al., pp. xv–xvii, 191–192, 241–242, 605–634, 1977.
"Digital and Analog Systems", 2nd ed., Leon W. Couch II, pp. vii–xxiii, & 245–263, 1987.

\* cited by examiner

*Primary Examiner*—Daniel S. Hunter
*Assistant Examiner*—Darnell R. Armstrong
(74) *Attorney, Agent, or Firm*—Blakely, Sokoloff, Taylor & Zafman LLP

(57) ABSTRACT

A method and apparatus for wide range automatic frequency control. A control signal indicating a frequency within one of a plurality of frequency bands is received by an oscillator. In response, the oscillator generates a tuning signal having the indicated frequency. Based on the tuning signal, receive logic receives an input signal to obtain a sequence of values. Compare logic compares the sequence of values to a predetermined pattern. If the sequence of values does not match the predetermined pattern, frequency control logic outputs a different control signal to the oscillator to adjust the frequency of the tuning signal to another one of the plurality of frequency bands. Another input signal is received to obtain a new set of values and the new set of values is compared the predetermined pattern. The frequency control logic outputs a sequence of control signals to the oscillator in this manner until the compare logic indicates that a sequence of values matches the predetermined pattern or until the oscillator has been tuned to each of the plurality of frequency bands.

48 Claims, 14 Drawing Sheets

METHOD AND APPARATUS FOR WIDE RANGE AUTOMATIC FREQUENCY CONTROL

FIELD OF THE INVENTION

The present invention relates to the field of radio frequency signal communication, and more particularly to a method and apparatus for wide range automatic frequency control.

BACKGROUND OF THE INVENTION

Wireless radio frequency (RF) receivers are designed to have a bandwidth of operation that is very close to the bandwidth of the signal of interest. Due to the small margin between the operational bandwidth of the receiver and the bandwidth of the signal of interest, such receivers can receive even low-powered signals while maintaining a relatively high signal-to-noise ratio (SNR). However, the small bandwidth margin also makes such receivers susceptible to tuning errors. Even a small tuning error can result in the signal of interest falling partly or completely outside the receiver's pass band, severely degrading receiver performance.

Tuning errors are often caused by inaccuracy and drift in the receiver's reference clock. For example, less expensive crystal oscillators tend to be less accurate and exhibit greater temperature dependence than more expensive crystal oscillators. Consequently, one way to avoid receiver tuning error is to use a highly accurate, temperature-invariant crystal reference. However, such components are too expensive to be used in many consumer products (e.g., electronic pagers, wireless modems, cell telephones, etc.) and it is preferable to design receivers to use lower cost, less accurate reference clocks.

One technique for tolerating a less accurate reference clock while maintaining a relatively high SNR is to use automatic frequency control (AFC) to adjust the tuning frequency of the receiver. Because the passband of the receiver is typically centered around the tuning frequency, adjusting the tuning frequency up and down effectively shifts the passband of the receiver up and down. Using AFC, the operational bandwidth of the receiver is effectively increased by the frequency range over which the tuning frequency can be adjusted, yet a narrow passband is maintained.

AFC is typically implemented by using negative feedback to control the output of a voltage-controlled crystal oscillator (VCXO). The VCXO outputs a tuning signal having a frequency that is increased and decreased according to the level of a control signal. The control signal is generated based on the difference between the frequency of the tuning signal and the frequency of the signal of interest (SOI). When the tuning signal frequency falls below the SOI frequency, a positive control signal is produced to increase the tuning signal frequency. Similarly, when the tuning signal frequency rises above the SOI frequency, a negative control signal is produced to decrease the frequency of the tuning signal.

A significant disadvantage of the above-described AFC scheme is that its frequency range is limited due to the fact that the receiver must determine the SOI frequency in order to properly control the VCXO. If the SOI falls outside the initial passband of the receiver, the SOI frequency cannot be determined and a reliable feedback signal cannot be supplied to the VCXO to adjust the tuning signal frequency. Consequently, the above-described AFC technique can typically increase the operational bandwidth of a receiver only by an amount equal to the SOI bandwidth.

SUMMARY OF THE INVENTION

A method and apparatus for wide range automatic frequency control are disclosed. An input signal is received based on a tuning signal having a frequency within one of a plurality of frequency bands. A sequence of values indicated by the input signal is compared to a predetermined pattern. If the sequence of values does not match the predetermined pattern, the frequency of the tuning signal is adjusted to be within another of the plurality of frequency bands.

BRIEF DESCRIPTION OF THE DRAWINGS

The present invention is illustrated by way of example and not limitation in the figures of the accompanying drawings in which like references indicate similar elements and in which.

DETAILED DESCRIPTION

In the present invention, a wide range automatic frequency control (WRAFC) technique is implemented in a radio frequency (RF) receiver to significantly increase the receiver's operational bandwidth without compromising the signal-to-noise ratio.

Figure 1:
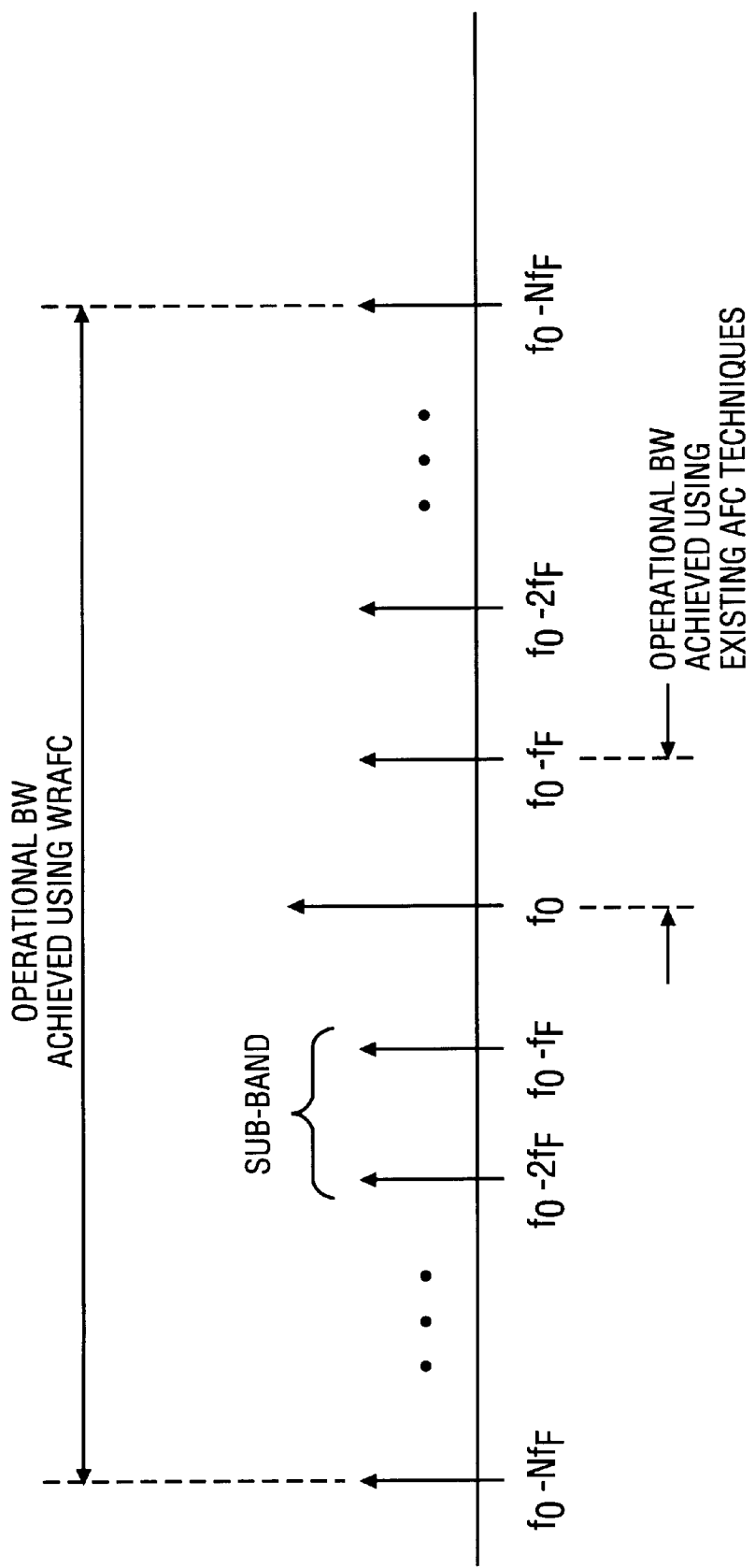
FIG. 1 is a spectral diagram illustrating the increased operational bandwidth achieved by wide range automatic frequency control.

FIG. 1 is a spectral diagram illustrating the increased operational bandwidth of a RF receiver according to the present invention. According to one embodiment, the receiver's operational bandwidth is divided into multiple, substantially non-overlapping frequency bands that are referred to herein as "sub-bands". The sub-bands are bounded by frequencies given by the expression:

$$f_o \pm k^* f_p$$

where $f_o$ is a center frequency of the receiver's operational bandwidth, $f_p$ is the passband of the receiver's bandpass filter and k=0,1,2,3 . . . N. As indicated, each of the sub-bands has a bandwidth approximately equal to the bandwidth that can be achieved using traditional AFC techniques.

When the RF receiver is turned on, the center frequency of an initial one of the sub-bands is output to be the tuning frequency of the receiver. A signal of interest is down-converted based on the tuning frequency, filtered and demodulated to generate a sequence of values. The sequence of values are compared against a predetermined pattern of values. If the sequence of values does not match the predetermined pattern, the center frequency of another one of the sub-bands is output to be the receiver tuning frequency and the procedure is repeated. Each of the sub-bands within the operational bandwidth is searched in this way until a sub-band encompassing the carrier frequency of the signal of interest is found. A limited-range AFC technique is then used to adjust the tuning frequency of the receiver within the identified sub-band to match the carrier frequency.

Figure 2:
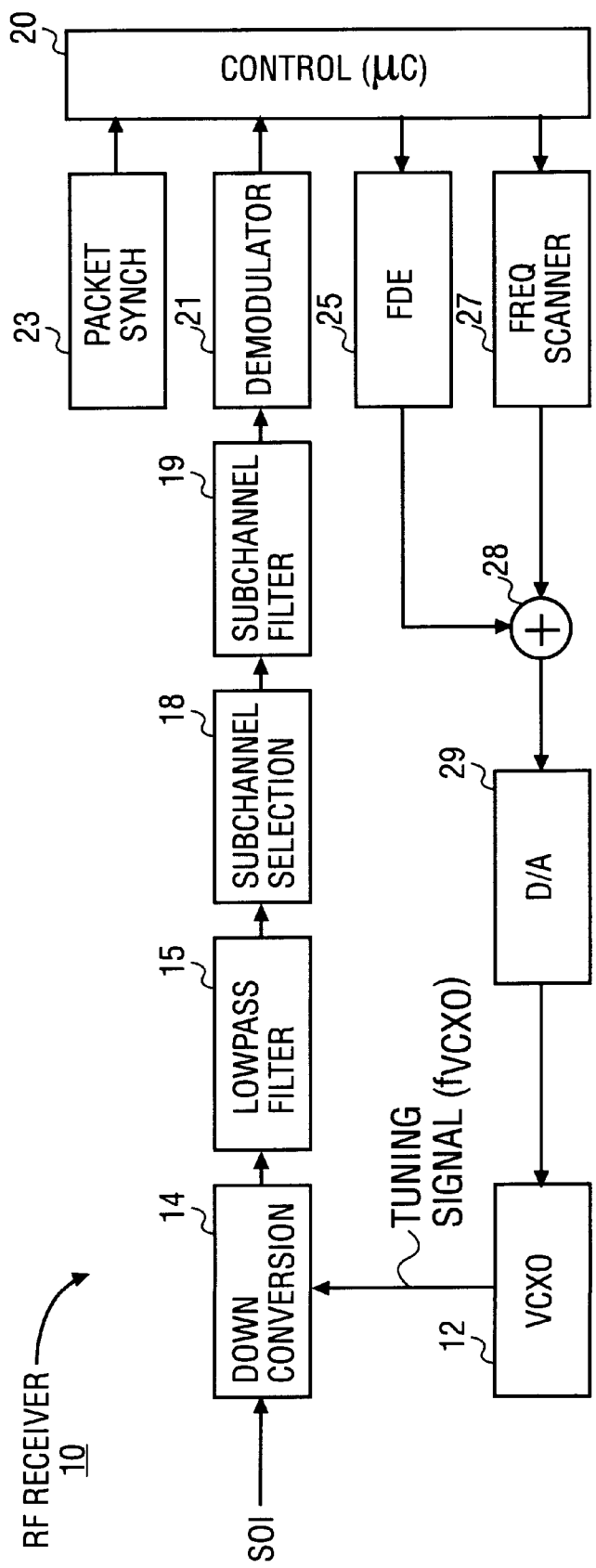
FIG. 2 is a block diagram of a RF receiver that implements wide range automatic frequency control.

FIG. 2 is a block diagram of a RF receiver 10 that implements wide range automatic frequency control according to one embodiment of the present invention. Generally, RF receiver 10 includes an oscillator 12, receive logic 14, 15, 18 and 19, compare logic 23, and frequency control logic 20, 25 and 27. The components of each of these logic units is discussed further below, starting with the receive logic.

An input signal which may or may not be a signal of interest (SOI) is first received at the down conversion block 14. Based on a tuning signal output by a voltage-controlled crystal oscillator (VCXO), the down conversion block 14 shifts the frequency of the input signal to baseband (i.e., to a signal having nonzero spectral magnitude in the vicinity of f=0 and negligible spectral magnitude elsewhere). Low pass filter 15 attenuates signal components having frequencies outside a passband defined by $\pm f_c$, the cutoff frequency of the low pass filter 15. In some applications, the signal of interest may actually be one of a number of sub-channels within the passband of the low pass filter 15. In those cases the subchannel selection block 18 is used to further down-convert the output of the low pass filter to obtain a baseband waveform at the subchannel frequency. The subchannel filter 19 is then applied to attenuate signal components having frequencies outside the subchannel filter passband.

The signal output by the subchannel filter 19 (or the output of the lowpass filter 15 if the subchannel components 18 and 19 are not present) is supplied to a demodulator 21. According to one embodiment of the present invention, the demodulator 21 outputs a signal to the FDE block 25 indicating a measure of the input signal frequency. The demodulator 21 also demodulates the input signal to generate a bitstream which is output to the packet sync block 23.

The packet sync block 23 is used to detect the presence of a predetermined bit sequence in the input signal. According to one embodiment of the present invention, the packet sync block compares the succession of input bits to a predetermined pattern of bits. If a matching sequence of input bits is not detected within a specified time (or after a specified number of comparisons), the packet sync block 23 outputs a "sync fail" signal to a controller 20. If a sequence of input bits does match the predetermined pattern, the packet sync block 23 outputs a "sync success" signal to the controller 20 indicating that the presently selected sub-band contains the signal of interest.

A sync fail signal from the packet sync block 23 indicates that the signal of interest was not found within the sub-band selected by the present tuning signal. The controller 20, in response to receiving the sync fail signal, signals the frequency scanner 27 to select another sub-band from the plurality of sub-bands that constitute the RF receiver's operational range. The frequency scanner 27 selects the next sub-band by outputting a value representing the center frequency of the sub-band. According to one embodiment of the present invention, the output of the FDE block 25 is reset (e.g., to zero) by the controller 20 in response to a sync fail signal. Consequently, the adder unit 28 passes the frequency value output from the frequency scanner 27 without change to a control input of the VCXO 12. The frequency of the tuning signal output by the VCXO 12 is adjusted in response to the new signal at the VCXO control input, and the data reception and comparison operations are repeated based on the new tuning signal frequency. If another sync fail signal is output by the packet sync block 23, the frequency scanner 27 is used to select another sub-band and the data reception and comparison operations are repeated again. The RF receiver 10 iteratively searches for the signal of interest in this manner until the signal of interest is detected within one of the sub-bands or until all of the sub-bands have been searched.

Assuming that a signal of interest is within one of the RF receiver's sub-bands, the frequency scanner 27 will eventually select that sub-band and adjust the tuning frequency of the receiver (via the VCXO 12) to the center of the sub-band. The signal of interest will then be received and compared to the predetermined bit pattern by the packet sync block 23. If input signal contains a pattern matching sequence of bits, the pattern sync block will output a sync success signal to the controller 20.

The sync success signal indicates that the signal of interest is located within the sub-band of the present tuning signal. However, there may still be a frequency difference between the carrier frequency of the signal of interest and the tuning signal frequency of the RF receiver 10. This frequency difference is referred to herein as an "in-band frequency offset" and is compensated by the FDE block 25. Consequently, in response to the sync success signal, the controller 20 enables the FDE block 25 to compute a frequency drift estimation value (FDE value) representing the in-band frequency offset. The FDE value is a measure of the difference between the carrier frequency of the signal of interest and the frequency of the tuning signal output by the VCXO 12. The FDE value is supplied to adder unit 28 where it is added to the output of the frequency scanner 27. The sum of the FDE value and the output of the frequency scanner is supplied to the VCXO 12 to adjust the tuning signal frequency within the present sub-band to correct the in-band frequency offset.

Figure 3:
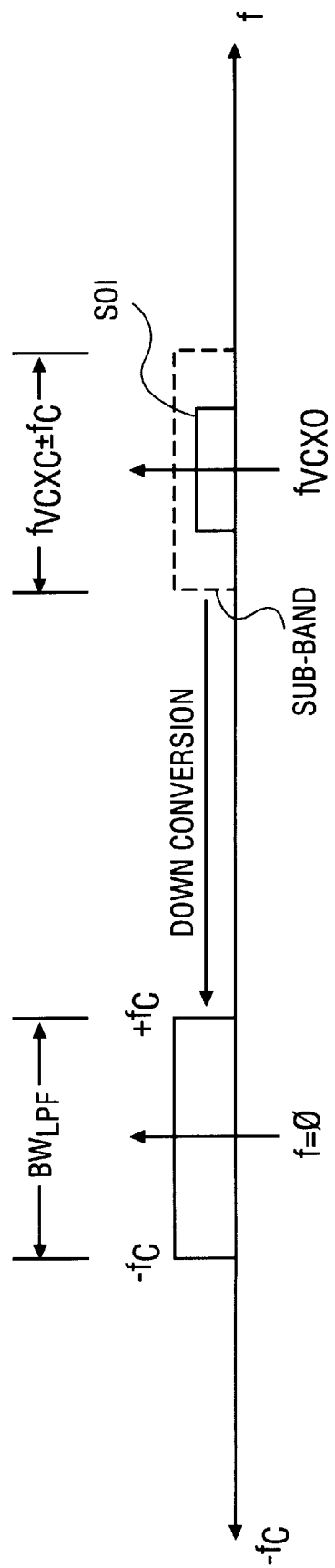
FIG. 3 is a spectral diagram illustrating down-conversion and filtering based on a tuning signal.

FIG. 3 is spectral diagram illustrating the operation of the down conversion block 14 and low pass filter 15 of FIG. 2. The tuning signal frequency $f_{VCXO}$ is adjusted to select one of the sub-bands of the operational bandwidth of the receiver. The width of the selected sub-band is $\pm f_c$, the passband of the low pass filter 15 of FIG. 2, so that the selected sub-band encompasses the frequency range $f_{VCXO} \pm f_c$. This is indicated by the dashed sub-band in FIG. 3. The down conversion block shifts the spectral components (i.e., "down-converts") within the sub-band to baseband (centered about f=0) so that the low pass filter can be applied. If, as shown in FIG. 3, the signal of interest is within the selected sub-band, the signal of interest is also down converted based on the tuning signal.

Figure 4:
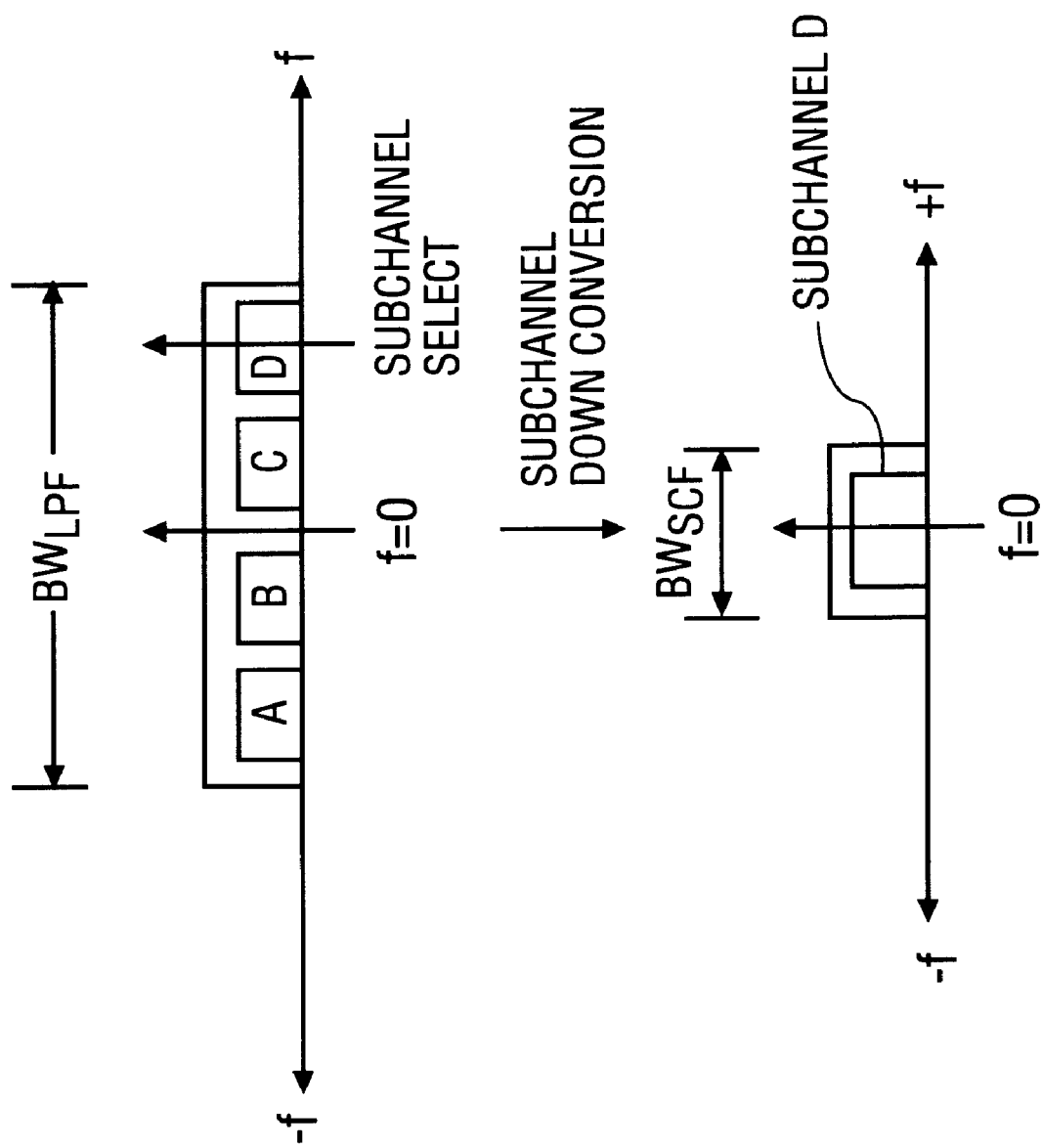
FIG. 4 is a spectral diagram illustrating subchannel selection and filtering.

FIG. 4 is a spectral diagram illustrating the operation of the subchannel selection block 18 and the subchannel filter 19 of FIG. 2. As shown, a number of subchannels A, B, C, D may be present in the output of the low pass filter (element 15 of FIG. 2). The subchannel selection block is used to down-convert the output of the low pass filter so that a selected channel A, B, C or D is shifted to baseband. The subchannel filter 19 is then applied to pass only spectral components within a narrow margin of the subchannel. Although four subchannels A, B, C, D are shown in FIG. 4, more or less subchannels may be present or there may be no subchannels at all.

Figure 5:
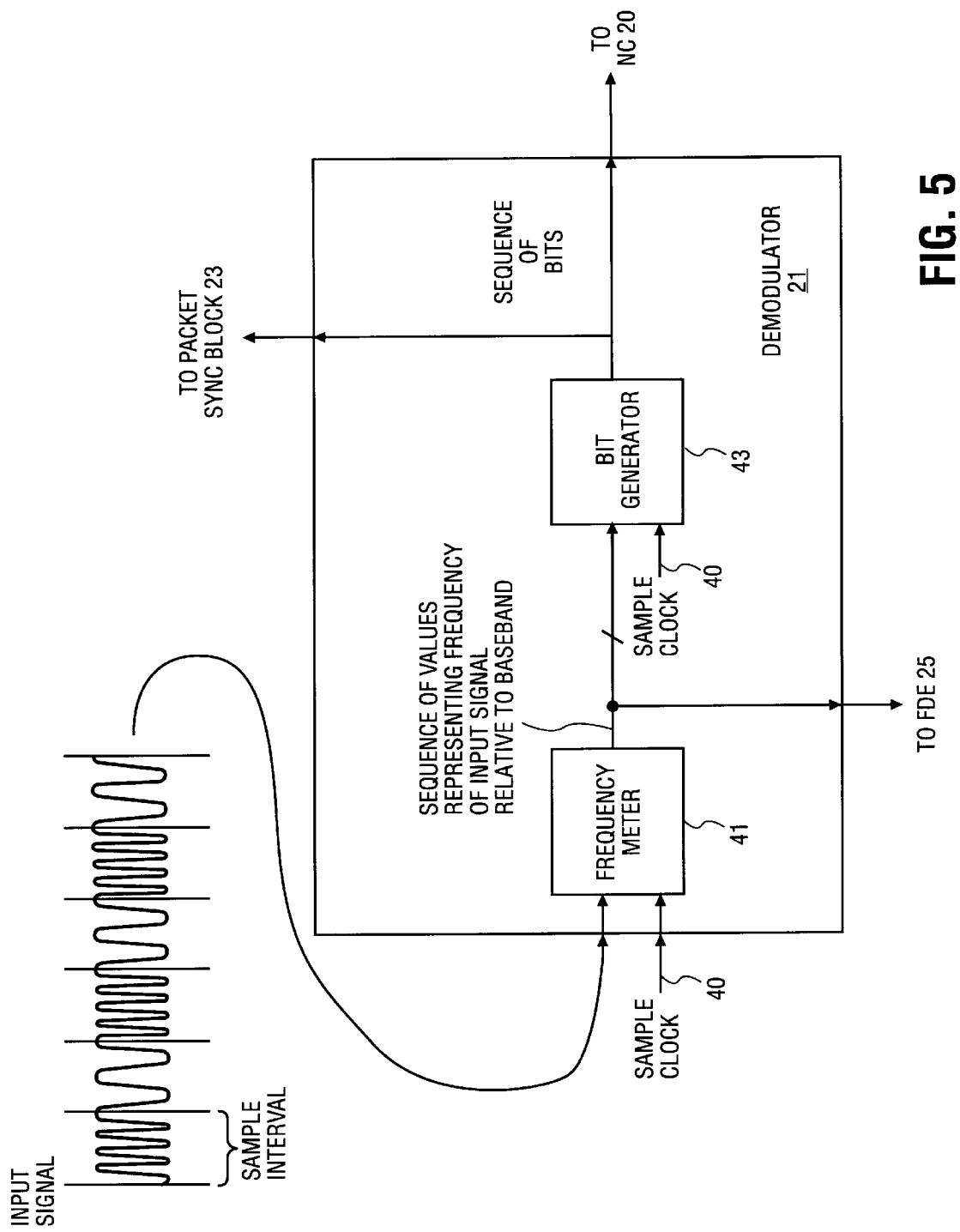
FIG. 5 is a diagram of a demodulator.

FIG. 5 is a block diagram of the demodulator 21. The structure and operation of the demodulator 21 is dependent upon the modulation technique used to transmit the signal of interest. For a phase modulated signal (e.g., phase shift key modulation (PSK)), the demodulator will include a phase detection component. For an amplitude modulated signal (e.g., quadrature amplitude modulation (QAM)), the demodulator 21 will include an amplitude and phase detection component. For a frequency modulated signal (e.g., frequency shift key modulation (FSK)), a frequency detection component is used. In the description which follows frequency modulation is assumed. Other modulation techniques including, but not limited to phase and amplitude modulation, may be used without departing from the scope of the present invention.

As shown in FIG. 5, a frequency modulated input signal is supplied to the input of the demodulator 21. According to one embodiment of the present invention, the signal of interest is frequency modulated by a four-level data signal (i.e., quadrature FSK) so that the carrier is modulated to one of four different frequencies during any sample interval. It will be appreciated that the carrier signal may be modulated by symbols having any number of levels.

According to one embodiment of the present invention, the demodulator 21 includes a frequency meter 41 that outputs a value indicating the frequency of the input signal relative to baseband for each cycle of a sample clock 40. The sample clock 40 is supplied by other circuitry within the RF receiver or within the device that includes the RF receiver. The frequency meter 41 outputs a sequence of frequency measurements to the FDE block 25 and to a bit generator 43. For each cycle of the sample clock 40, the bit generator generates one or more bits (e.g., two bits for a quadrature FSK signal, one bit for a binary FSK signal) as indicated by the frequency measurement. The bits generated by the bit generator 43 constitute a bitstream that is supplied to the packet sync block 23 and to the controller 20. As discussed below, the packet sync block 23 and the controller 20 may be implemented by a programmed processor. In that case, the bit generator 43 outputs the bitstream only to the programmed processor.

Figure 6:
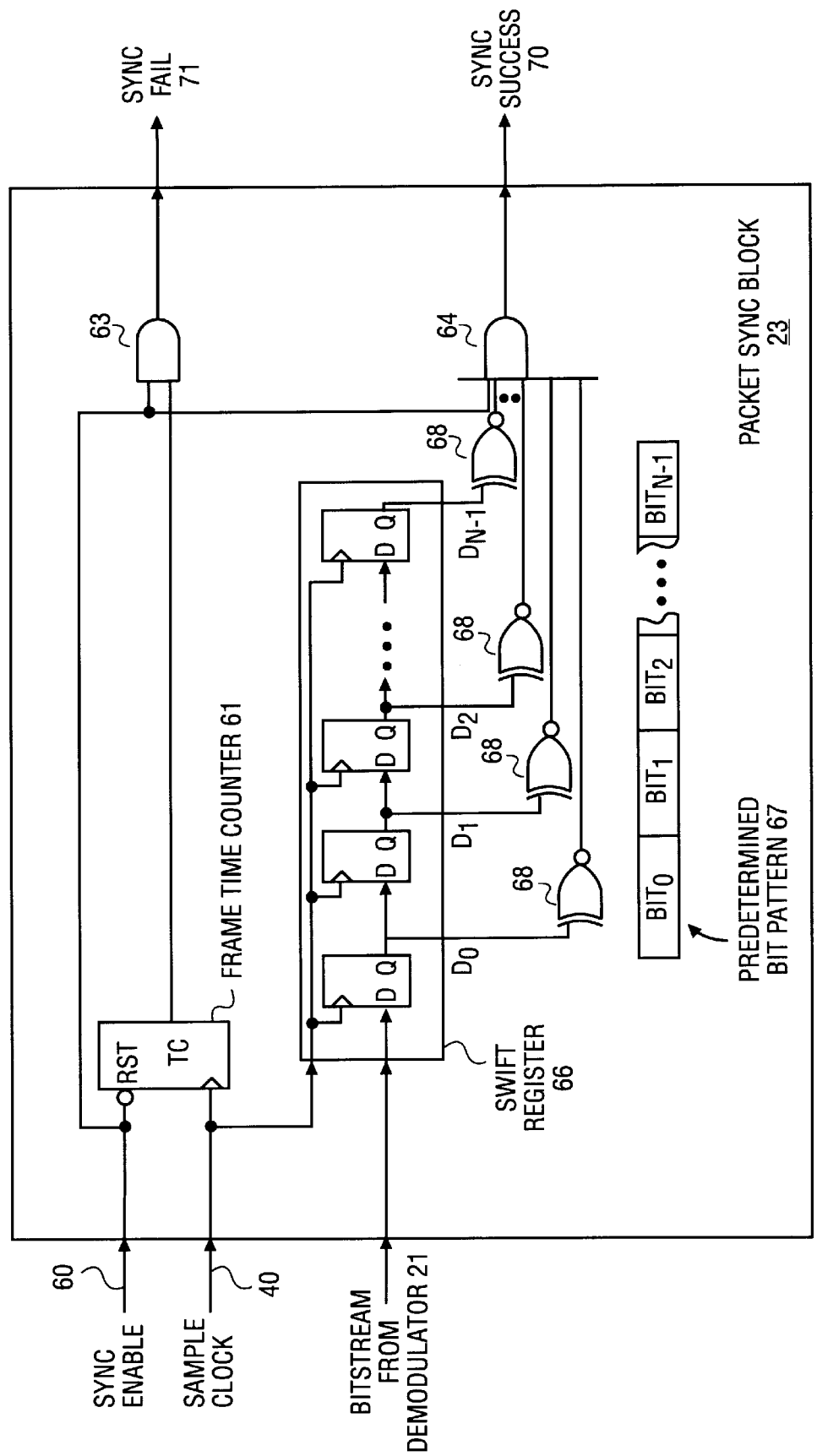
FIG. 6 is a diagram of a packet sync block.

FIG. 6 is a diagram of the packet sync block 23 according to one embodiment of the present invention. The packet sync block 23 receives the bitstream output by the demodulator 21, the sample clock 40 and a sync enable signal 60 from the controller as inputs. The sample clock 40 is supplied to clock inputs of a frame time counter 61 and a shift register 66. The bitstream from the demodulator is shifted into the shift register 66 and compared to a predetermined bit pattern 67 using compare logic elements 68. If the sync enable signal has been asserted by the controller, and if a sequence of bits within the input bitstream matches the predetermined pattern of bits, logic gate 64 will output a signal indicating sync success to the controller.

Figure 7:
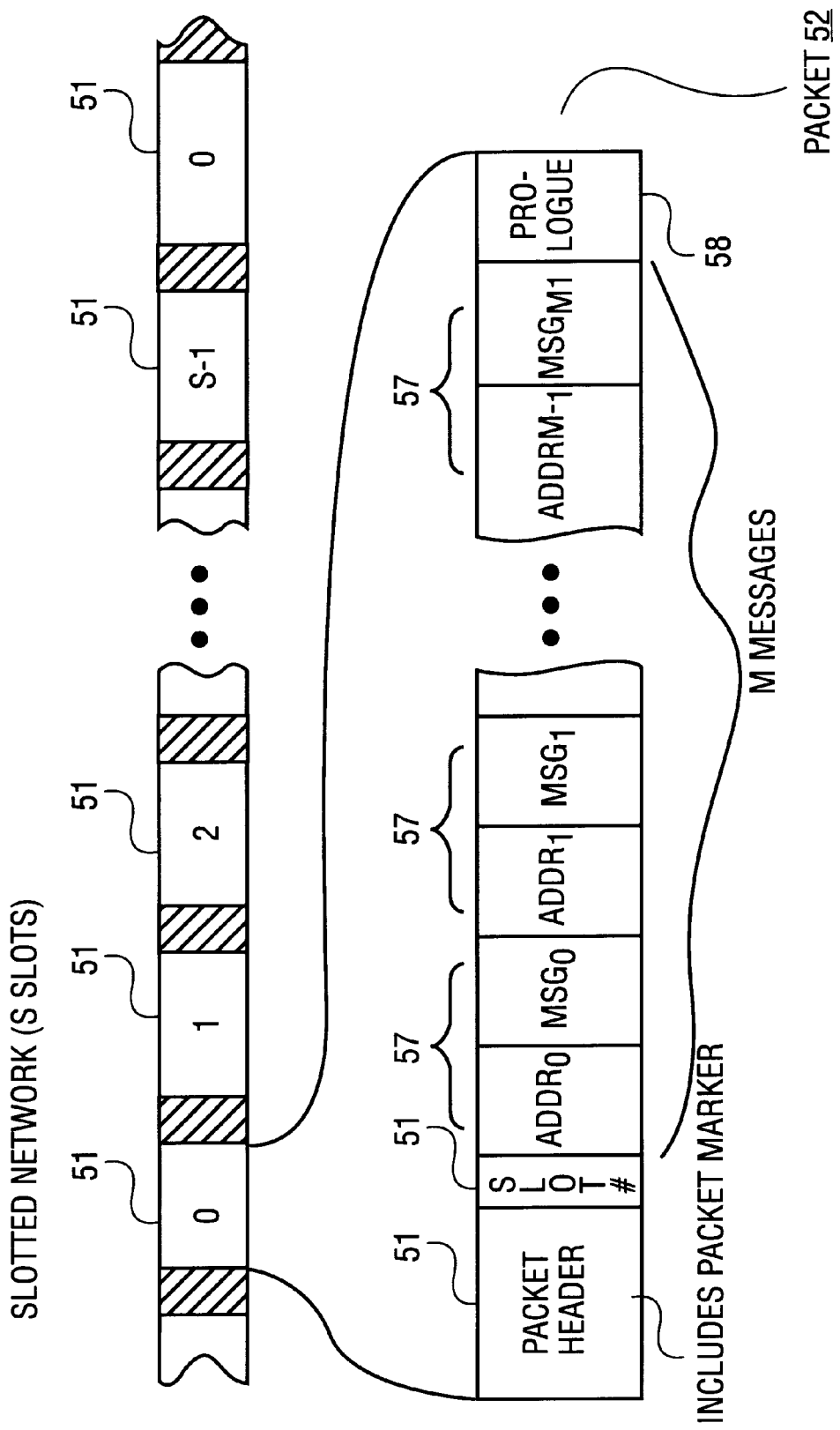
FIG. 7 is a diagram illustrating a slotted network transmission format.

The frame time counter is used to implement a time-out function if a pattern matching sequence of bits is not found within a predetermined search time (or predetermined number of shift operations). The search time is usually determined based on the protocol of the transmitted signal. FIG. 7, for example, illustrates a transmission format that is common in slotted networks. Slotted networks are often used to transmit messages to wireless handheld devices like electronic pagers.

In a slotted network, frames of data referred to as "packets" are transmitted in a repeating sequence of slots 51. This scheme allows the transmission band to be time-division-multiplexed among the different slots. Referring to slots 51, for example, some devices may expect to receive messages in slot 0 packets, while others expect receive messages in slot 1 packets, and so forth. To allow devices to identify the start of a packet, each packet typically includes one or more predetermined sequence of bits referred to herein as a packet marker. Because the same marker is typically transmitted at the start of every packet, the detection or non-detection of a packet marker within one frame time can be used in the present invention to determine whether the signal of interest is present in a given sub-band. As indicated in FIG. 7, in a slotted network transmission, the packet marker is typically included in a packet header 53, which is followed by the packet slot number 54, a number M of device-addressed messages, and a prologue 58.

Returning to FIG. 6, the frame time counter 61 is used to determine when an entire frame of bits has been shifted through the shift register 66. According to one embodiment of packet sync block 23, when the sync enable signal is deasserted, the frame time counter is reset to a predetermined start count representing the interval of time (or number of sample intervals) over which the input stream is to be searched for the predetermined bit pattern. When the sync enable signal is asserted, the frame time counter 61 begins counting down from the starting count to a terminal count value (typically zero). The frame time counter may also count up to the terminal count (e.g., from zero to the starting count). In either case, if the terminal count is reached before a pattern-matching sequence of input bits is received, the terminal count signal is asserted to logic gate 63 which then outputs a sync fail signal to the controller. According to one embodiment of the present invention, the controller deasserts the sync enable signal after receiving the sync success or sync fail signal.

Though not shown, the packet sync block 23 will typically include additional logic to suppress the sync success signal until residual bits in the shift register (e.g., from power-up or from a previous pattern search) have been shifted out. Also, while a hard-wired logic implementation of the packet sync block 23 is shown in FIG. 7, the shift, compare and time-out functions may alternatively be implemented by a programmed processor.

Figure 8:
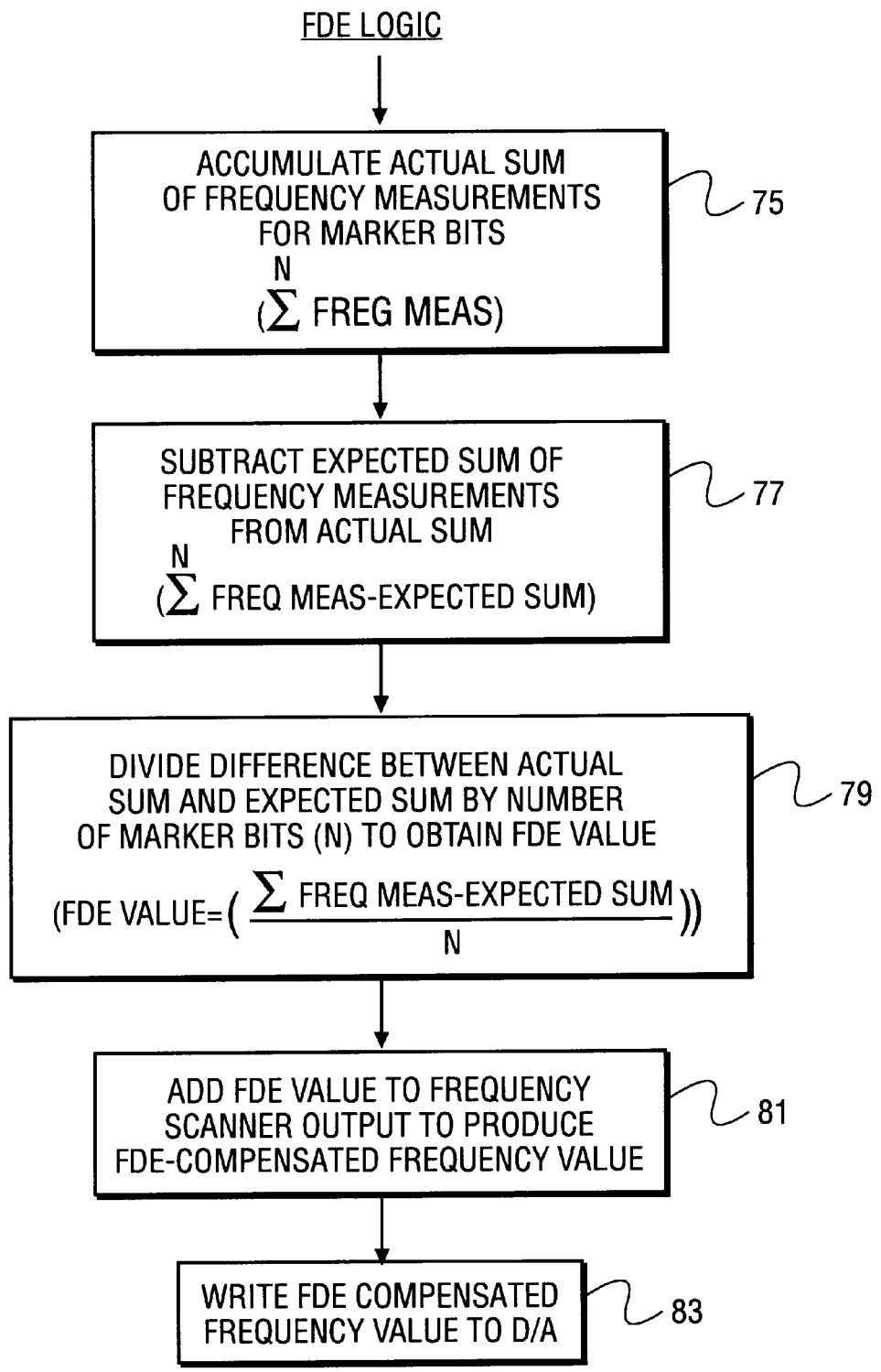
FIG. 8 is a flow diagram of a frequency drift estimator.

FIG. 8 is a flow diagram of a programmed processor implementation of the FDE block 25. According to one embodiment of the present invention, an accurate determination of an in-band frequency offset is made by accumulating a sum of frequency measurements for a packet marker at step 75, subtracting the expected sum of measurements at step 77 (i.e., the sum that would result if their were no in-band frequency offset), and then dividing the difference by the number of marker bits at step 79 to obtain an FDE value that can be used to correct the in-band frequency offset.

The equivalence between an FDE value obtained in step 79 and the in-band frequency offset ($\Delta f$) is shown by the following:

a) The number of bits in the packet marker (N) is equal to the sum of the number marks (i.e., "1's") and the number of spaces (i.e., "0's". That is:
N=#marks+#spaces b) Because of down-conversion to baseband, the mark frequency (markf) and the space frequency (spacef) are ideally related by:
spacef=−1*markf c) The expected sum of frequency measurements is given by:
Expected Sum=#marks*markf+#spaces*spacef
d) Assuming an in-band offset ($\Delta f$), the actual sum of frequency measurements will be:
Actual Sum=#marks*(markf+$\Delta f$)+#spaces*(spacef+$\Delta f$)= (#marks+#spaces)*$\Delta f$+#marks*markf+ #spaces*spacef=N*$\Delta f$+Expected Sum
e) Consequently,
$\Delta f$=(Actual Sum−Expected Sum)/N, the FDE value obtained in step 79.

Note that in the above discussion, binary encoding is assumed (i.e., one bit per symbol). However, the technique may be adapted to produce an FDE value for encoding of any number of bits per symbol. Note also that if N is reasonably large (e.g., >32), small errors in frequency measurement tend to be averaged out so that an accurate FDE value may be obtained.

Returning to FIG. 8, the FDE value is added to the output of the frequency scanner (e.g., element 27 of FIG. 2) to produce an FDE-compensated frequency control value. In FIG. 2 adder unit 28 is used to add the frequency scanner output and the FDE value, but this operation may also be accomplished by adding the frequency scan value and the FDE value in a processor (e.g., controller 20 of FIG. 2) and then outputting the sum. In either case, at step 83 the FDE-compensated frequency control value is written to the digital-to-analog converter (e.g., element 29 of FIG. 2) which, in turn, generates an FDE-compensated control signal to the VCXO to adjust the tuning signal within the sub-band.

Figure 9:
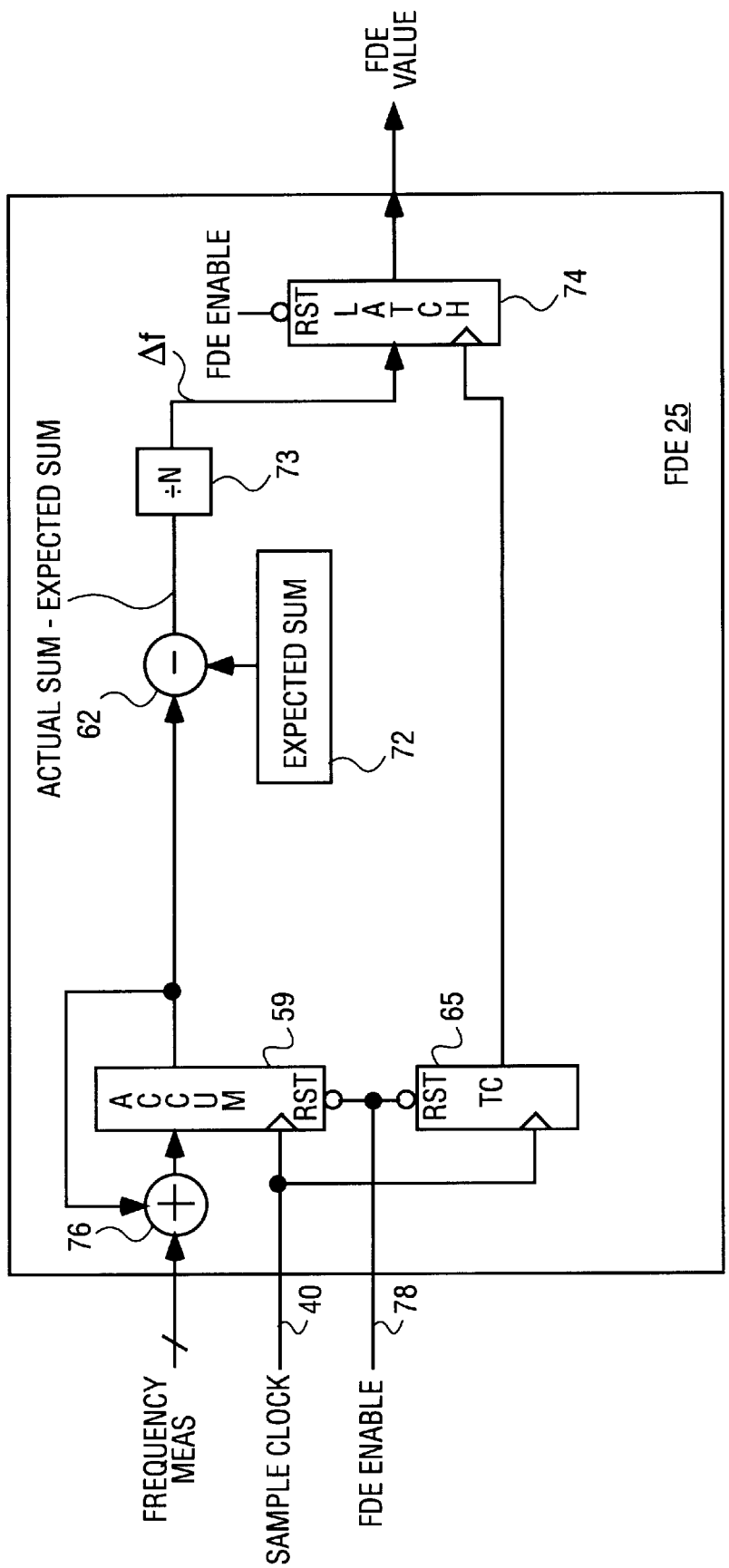
FIG. 9 is a circuit diagram of a frequency drift estimator.

FIG. 9 is a diagram of a circuit implementation of the FDE block 25. According to one embodiment of the present invention, the FDE block 25 receives the sample clock 40, an FDE enable signal 78 from the controller (element 20 of FIG. 2) and frequency measurements from the demodulator (element 21 of FIG. 2) as inputs. The FDE block 25 includes adder unit 76, accumulation register 59, counter 65, difference unit 62, divide unit 73, a storage to hold an expected sum 72 and output latch 74 to output an FDE value. In an alternate embodiment of the FDE block 25, the expected sum is received as an input signal.

In one embodiment, a deasserted FDE enable signal resets the counter 65 to a start count, and resets the accumulation register 59 and the output latch to zero. That way, the FDE block 25 does not affect the tuning frequency of the receiver until it is enabled by the controller. When the FDE enable signal 78 is asserted, the contents of the accumulation register 59 are added by adder unit 76 to a frequency measurement received from the demodulator (e.g., element 21 of FIG. 2) for each cycle of the sample clock 40. The expected sum is subtracted from the accumulator output in difference unit 62 and the difference is divided by a value N in divider unit 73. The counter 65 outputs a terminal count signal TC after counting N cycles of the sample clock. The terminal count signal TC is used to strobe latch 74 so that the output of the divider unit 73 is strobed into latch 74 after N frequency measurements have been accumulated. Consequently, the FDE value output by the FDE block 25 is the difference between the actual sum of N frequency measurements and the expected sum divided by N. As discussed above, this is a measure of the in-band frequency offset.

Figure 10:
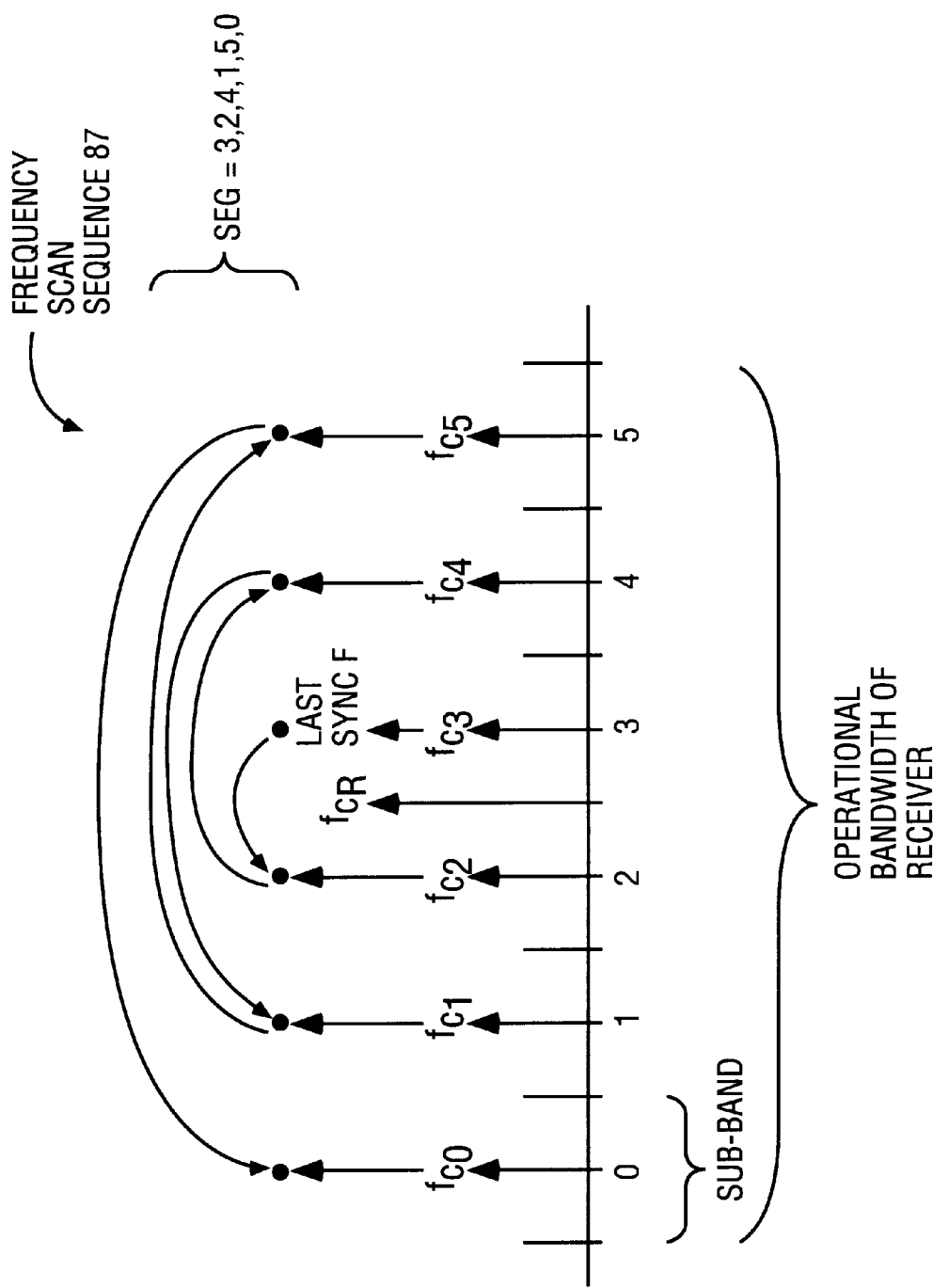
FIG. 10 is a diagram of a frequency scan sequence.
Figure 11:
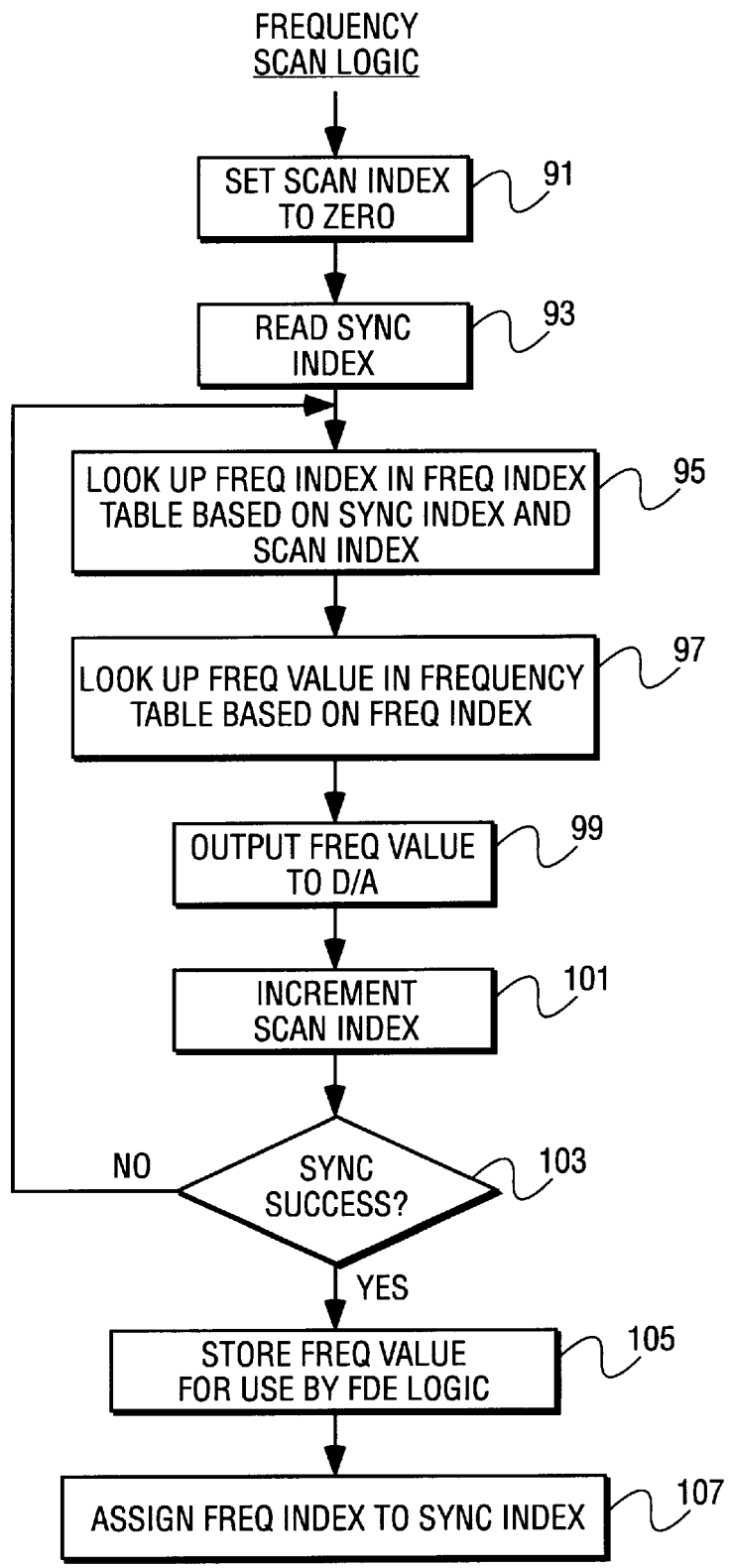
FIG. 11 is a flow diagram of frequency scan logic.
Figure 12:
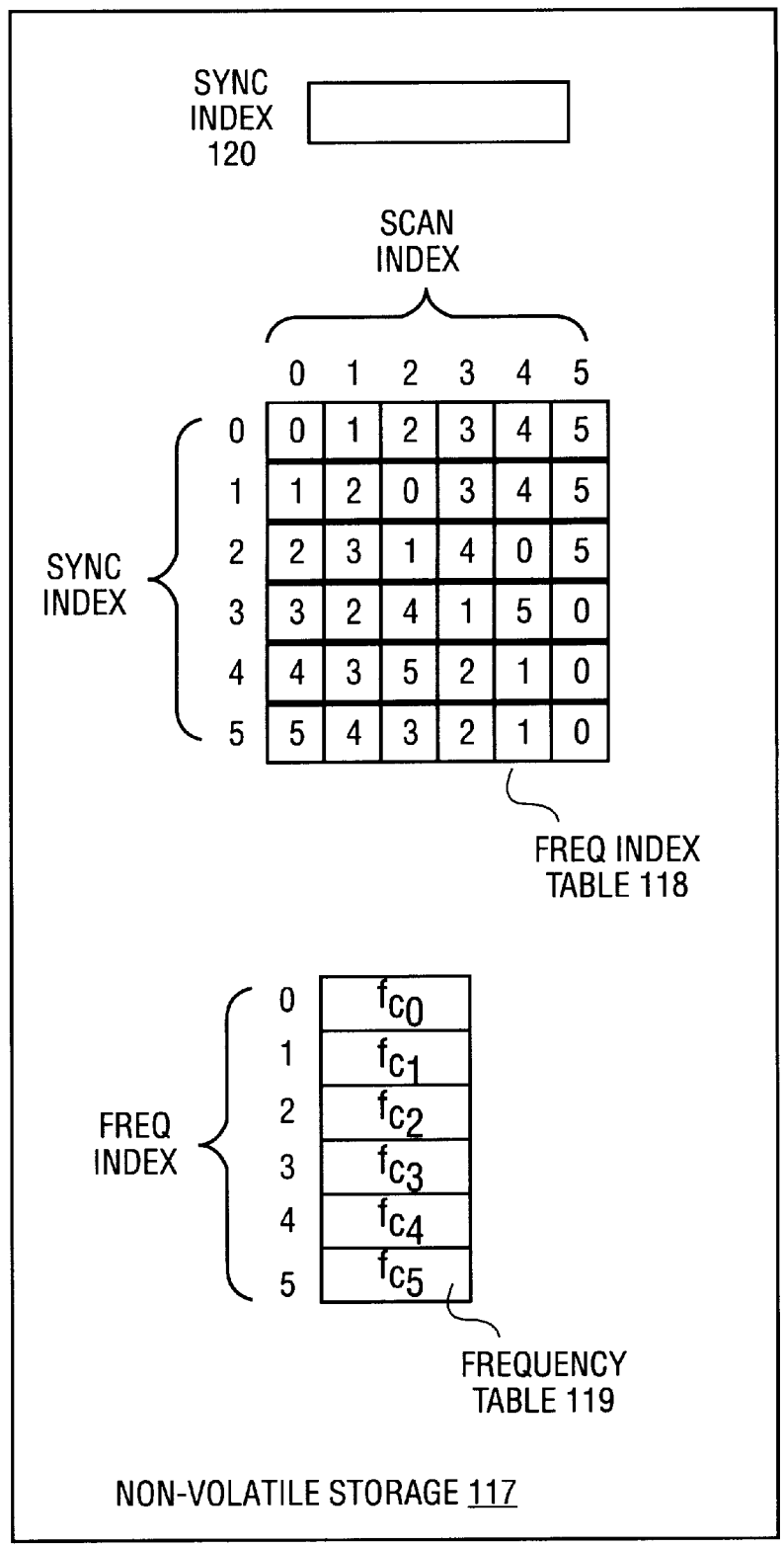
FIG. 12 is a non-volatile storage used to store frequency scan data.

FIG. 10, FIG. 11 and FIG. 12 are provided to explain the operation of the frequency scanner 27 of FIG. 2. The frequency scanner 27 controls the order in which the sub-bands of the RF receiver's operational bandwidth are searched.

In FIG. 10, the operational bandwidth of an exemplary RF receiver is depicted as ranging over six sub-bands. Each sub-band is defined by a respective tuning frequency ($f_{c0}$, $f_{c1}$, $f_{c2}$, $f_{c3}$, $f_{c4}$, $f_{c5}$) and has an associated index (0, 1, 2, 3, 4, 5). According to one embodiment of the present invention, the tuning frequency of the sub-band in which a signal of interest was last received is recorded for later use. This frequency is referred to herein as the "sync frequency" and the index of the sub-band containing the sync frequency is referred to as the "sync index". For example, in FIG. 10 the most recent sync frequency is $f_{c3}$ and the sync index is three. In one embodiment, the frequency scanner causes the sub-bands to be searched in a frequency scan sequence 87 that is determined as follows:
a) First, search the sub-band indicated by the sync index.
b) If the signal of interest is not found in step a), search the sub-band(s) that are adjacent the previously searched frequency-range beginning with the adjacent sub-band that is nearest the center frequency of the operational bandwidth of the receiver (depicted as $f_{CR}$ in FIG. 10).
c) Repeat step b) until either a new sync frequency is determined (i.e., signal of interest found) or all of the sub-bands have been searched.

Referring to FIG. 10, for example, application of the above logic results in sub-bands being searched according to frequency scan sequence 87 as follows:
step a) sub-band 3 (indicated by the sync index)
step b) sub-band 2 (adjacent sub-band 3 and nearer to $f_{CR}$ than sub-band 4) sub-band 4 (adjacent sub-band 3)
step c) sub-band 1 (adjacent the range of sub-bands 2, 3, 4 and nearest $f_{CR}$) sub-band 5 (adjacent the range of sub-bands 2, 3, 4)
step c) sub-band 0 (adjacent the range of sub-bands 1, 2, 3, 4, 5)

Other techniques may be implemented to establish a frequency scan sequence without departing from the scope of the present invention.

Referring now to FIG. 11, a flow diagram of the operation of the frequency scanner is provided. According to one embodiment of the present invention, the frequency scanner is implemented by a programmed processor that accesses frequency scan information from a non-volatile storage 117 shown in FIG. 12. In one embodiment, storage locations in the non-volatile storage 117 are allocated for a sync index 120, a frequency index table 118 and a frequency table 119. The sync index 120 is the index of the sub-band in which a signal of interest was last detected. The frequency index table 118 is a table of predetermined frequency scan sequences. According to one embodiment of the table 118, one frequency scan sequence is recorded for each possible value of the sync index. The frequency table 119 is a table of frequency control values which, when written to the D/A (e.g., element 29 of FIG. 2), cause the D/A to assert a control voltage to the VCXO (element 12 of FIG. 2) to adjust the tuning signal output by the VCXO to the center frequency of the selected sub-band. One advantage of storing frequency control values in a non-volatile table (e.g., table 119) is that non-linearity in the tuning signal generation path (e.g., the D/A or the VCXO) can be empirically determined during manufacture and compensated in the tabulated frequency control values.

Returning to FIG. 11, at step 91, a counter variable called "scan index" is reset to zero. The scan index used to indicate the number of sub-band searches that have been completed in a give frequency scan operation. At step 93, the sync index is read from non-volatile storage 117. At step 95, a frequency index (i.e., index of a sub-band) is looked up in the frequency index table 118 based on the sync index (table row index) and the scan index (table column index). The frequency index is then used to lookup a frequency control value from the frequency table 119 in step 97. At step 99, the frequency control value is output to the D/A, which results in a control voltage to the VCXO to adjust the tuning signal to the indicated frequency. At step 101, the scan index is incremented to indicate the next column of the frequency index table 118. If, at decision block 103, sync success is detected, then the frequency value is stored for use by the FDE at step 105. This allows a later-computed FDE value to be added to the frequency control value to compensate for in-band frequency offset. At step 107, the frequency index is stored in non-volatile memory at sync index location 120. Note that this requires the sync index location to be writeable and non-volatile (e.g., an electrically erasable non-volatile memory component such as a flash memory element). This is in contrast to the frequency table 119 and the frequency index table 118 which may be stored in a write once-read many memory like a programmable read-only-memory (PROM). Any combination of non-volatile memory components may be used to implement non-volatile storage 117 without departing from the scope of the present invention.

If sync success is not detected at step 103, then execution of the method of FIG. 11 loops back to step 95 to look up a new frequency index. Steps 95, 97, 99 and 101 are repeated in this fashion until sync success is detected or until all of the sub-bands have been searched (e.g., scan index incremented past last column of frequency index table 118). At that point, the scan-index may be reset and the sub-bands searched again or the frequency scan operation may be aborted.

Figure 13:
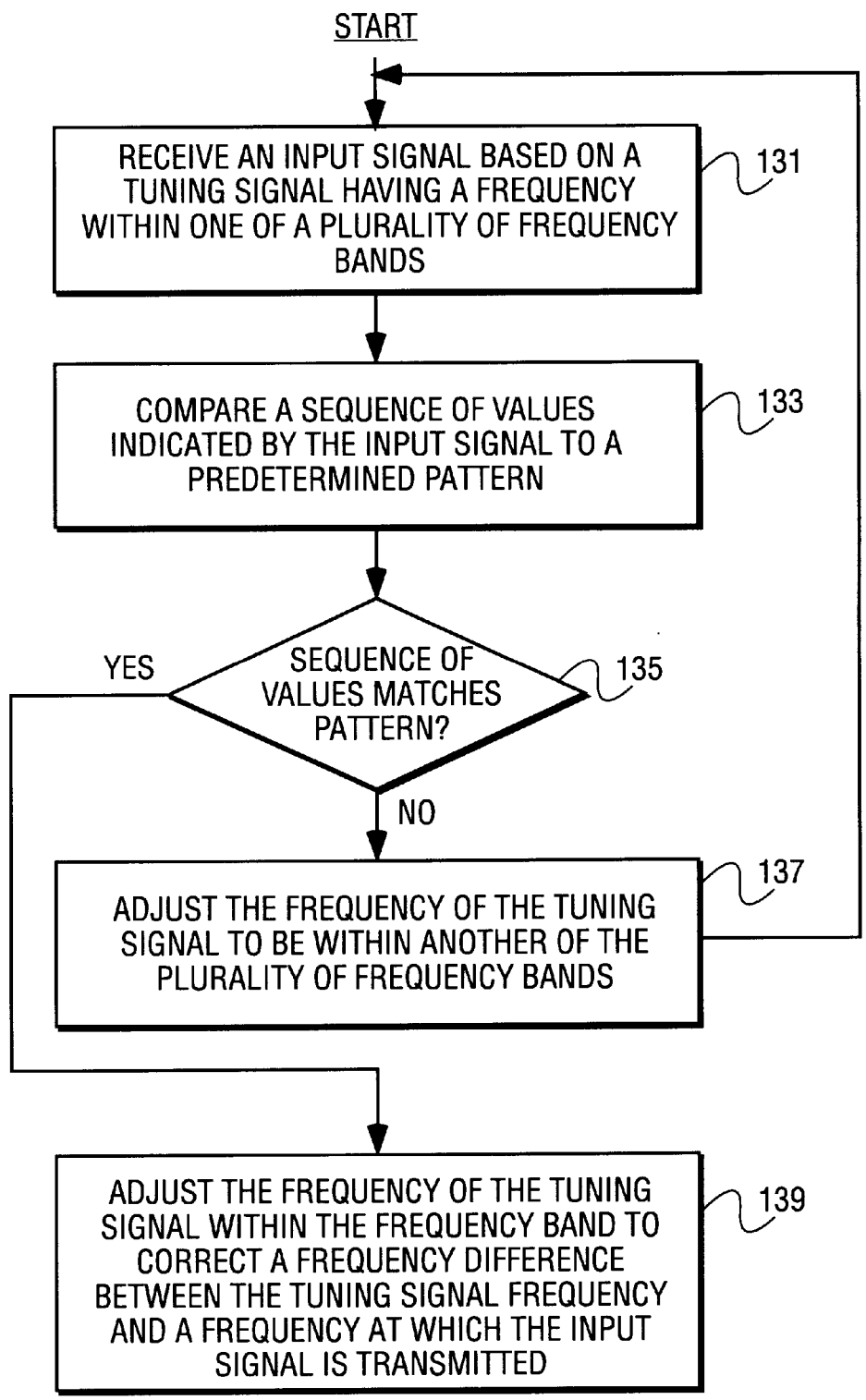
FIG. 13 is a diagram of a method according to one embodiment of the present invention.

FIG. 13 is a flow diagram of a generalized method according to the present invention. At step 131, an input signal is received based on a tuning signal having a frequency within one of a plurality of frequency bands. Note that the input signal may be no more than a noise signal at this point, and therefore is not necessarily the signal of interest. At step 133, a sequence of values indicated by the input signal are compared to a predetermined pattern of values. If the sequence of values matches the pattern in decision step 135, then at step 139, the frequency of the tuning signal is adjusted within the frequency band to correct a frequency difference between the tuning signal and the transmission frequency of the input signal. If the sequence of values does not match the pattern in decision step 135, the frequency of the tuning signal is adjusted to be within another of the plurality of frequency bands at step 137 and execution is looped back to step 131 to receive an input signal based on the adjusted tuning signal frequency. The steps of receiving, comparing and adjusting are repeated until a sequence of values matching the predetermined pattern is found, or until each of the plurality of frequency bands has been searched. If each of the plurality of frequency bands has been searched without detecting a pattern matching sequence of values, the entire method of FIG. 13 may be repeated or the device in which the method is implemented may alert the user that it is out of range or automatically shut down.

Figure 14:
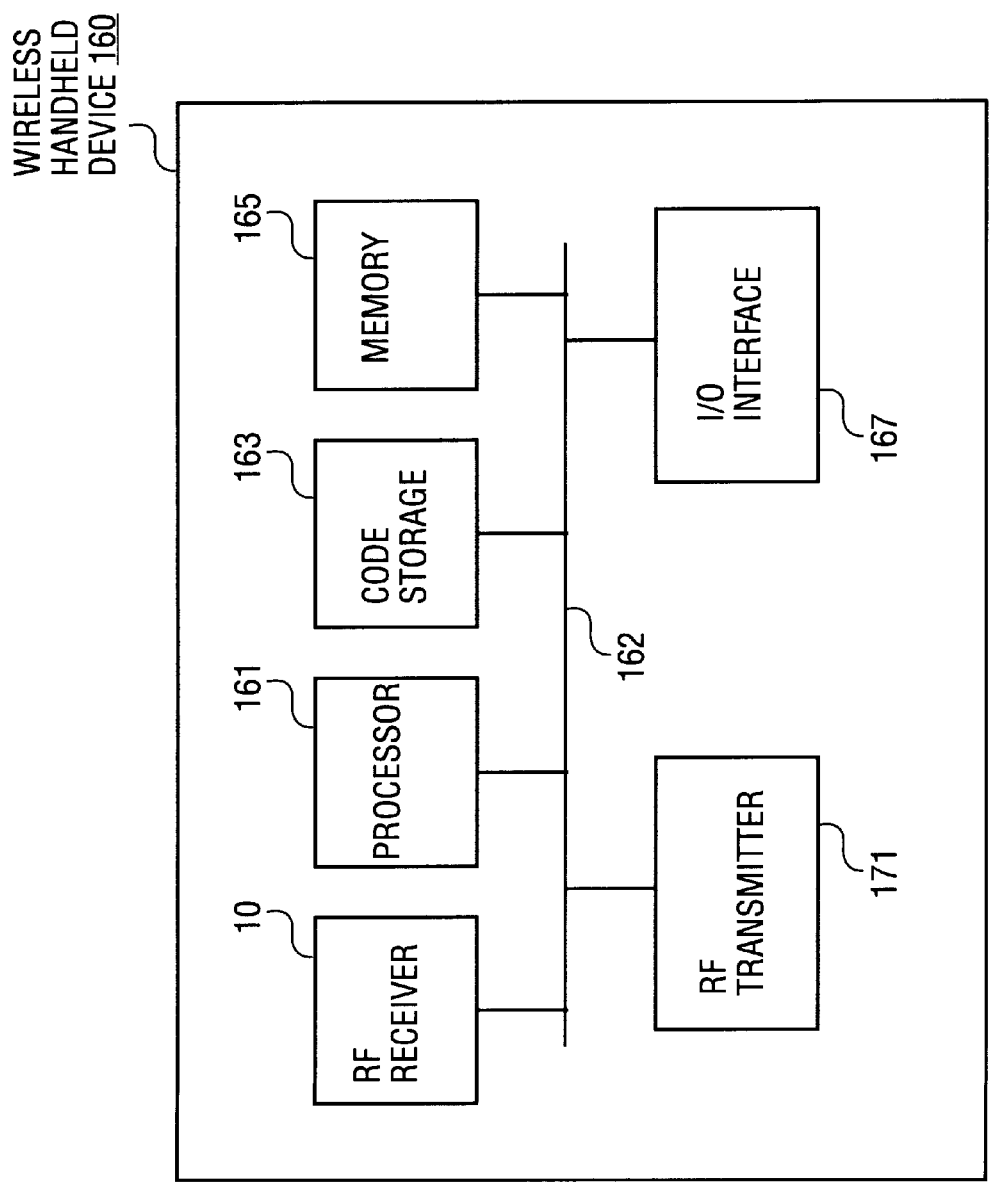
FIG. 14 is a diagram of a wireless handheld device in which an RF receiver and a method according to the present invention may be implemented.

FIG. 14 is a system level diagram of a wireless handheld device 160 in which the RF receiver and method of the present invention may be implemented. Device 160 may be a one-way or two-way electronic pager, a wireless modem, a cell telephone or any other device for receiving RF transmissions. Device 160 includes a RF receiver 10, a processor 161, a non-volatile code storage 163, a memory 165, and an I/O interface 167, all intercoupled by a bus 162.

In the case of a two-way electronic pager, cell telephone, wireless modem or other device which must transmit as well as receive RF communications, a RF transmitter 171 may also be provided.

According to one embodiment of the present invention, the processor 161 executes program code stored in code storage 163 to implement the controller of the RF receiver 10 (element 20 of FIG. 2) and to perform other functions of the device 160. Memory 165 is used to store the results of intermediate calculations and other program variables. The I/O interface 167 will typically include an assortment of components coupled to bus 162 that varies based on the application of the device 160. For example, if device 160 is an electronic pager, I/O interface 167 would typically include a number of buttons to receive user input, a display for displaying messages and other information and a notification element such as a beeper or vibrator to notify the user that a message has been received. In the case of a cell telephone, I/O interface 67 would typically include a numeric keypad, certain control buttons, a microphone and a speaker. In other applications I/O interface 167 may include other components to provide application-specific functionality.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly to be regarded in an illustrative rather than a restrictive sense.

What is claimed is:

1. A method comprising:
   (a) receiving an input signal based on a tuning signal having a frequency within one of a plurality of frequency bands;
   (b) comparing a sequence of input bits indicated by the input signal to a predetermined pattern of bits; and
   (c) adjusting the frequency of the tuning signal to be within another of the plurality of frequency bands if the sequence of input bits does not match the predetermined pattern of bits.

2. The method of claim 1 further comprising the step of (a), (b), and (c) repeating until the sequence of input bits match the predetermined pattern of bits.

3. The method of claim 2 further comprising adjusting the frequency of the tuning signal by less than half the bandwidth of one of the plurality of frequency bands to correct a frequency difference between the tuning signal frequency and a frequency at which the input signal is transmitted if the sequence of input bits match the predetermined pattern of bits.

4. The method of claim 3 wherein adjusting the frequency of the tuning signal by less than half the bandwidth of one of the plurality of frequency bands includes comparing a sum of frequency measurements of the input signal against an expected sum of frequency measurements.

5. The method of claim 4 wherein the expected sum of frequency measurements is based on expected modulation of the input signal to generate a sequence of input bits matching the predetermined pattern of bits.

6. The method of claim 1 wherein adjusting the frequency of the tuning signal includes reading a value indicating the frequency to which the tuning signal is to be adjusted from a table of previously stored values, each value in the table of previously stored values indicating a tuning frequency within a respective one of the plurality of frequency bands.

7. An apparatus comprising:
  means for receiving an input signal based on a tuning signal having a frequency within one of a plurality of frequency bands;
  means for comparing a sequence of input bits indicated by the input signal to a predetermined pattern of bits; and
  means for adjusting the frequency of the tuning signal to be within another of the plurality of frequency bands if the sequence of input bits do not match the predetermined pattern of bits.

8. The apparatus of claim 7 further comprising means for repeatedly enabling the means for receiving, the means for comparing and the means for adjusting until the sequence of input bits match the predetermined pattern of bits.

9. The apparatus of claim 8 further comprising means for adjusting the frequency of the tuning signal by less than half the bandwidth of one of the plurality of frequency bands to correct a frequency difference between the tuning signal frequency and a frequency at which the input signal is transmitted.

10. The apparatus of claim 9 wherein means for adjusting the frequency of the tuning signal by less than half the bandwidth of one of the plurality of frequency bands includes means for comparing a sum of frequency measurements of the input signal against an expected sum of frequency measurements.

11. The apparatus of claim 10 wherein the expected sum of frequency measurements is based on expected modulation of the input signal to generate a sequence of input bits matching the predetermined pattern of bits.

12. The apparatus of claim 7 wherein the means for adjusting the frequency of the tuning signal includes means for reading a value indicating the frequency to which the tuning signal is to be adjusted from a table of previously stored values, each value in the table of previously stored values indicating a tuning signal frequency within a respective one of the plurality of frequency bands.

13. An apparatus comprising:
  receive logic to receive an input signal based on a tuning signal having a frequency within one of a plurality of frequency bands;
  compare logic to compare a sequence of input bits indicated by the input signal to a predetermined pattern of bits; and
  band select logic to adjust the frequency of the tuning signal to be within another of the plurality of frequency bands if the sequence of input bits do not match the predetermined pattern of bits.

14. The apparatus of claim 13 further comprising control logic to enable the receive logic, compare logic and band select logic to repeat their respective reception, comparison and adjustment operations until the sequence of input bits matches the predetermined pattern of bits.

15. An apparatus comprising:
  an oscillator to receive a control signal and to generate a tuning signal having a frequency indicated by the control signal;
  receive logic to receive an input signal based on the tuning signal to obtain a sequence of input bits;
  compare logic to compare the sequence of input bits to a predetermined pattern of bits; and
  first frequency control logic to output a sequence of control signals to the oscillator until the compare logic indicates that the sequence of input bits matches the predetermined pattern of bits, each control signal of the sequence of control signals indicating a frequency within a respective one of a plurality of frequency bands.

16. The apparatus of claim 15 further comprising second frequency control logic to output an adjust signal that is combined with one control signal of the sequence of control signals to adjust the frequency of the oscillator within one of the plurality of frequency bands to correct a frequency difference between the tuning signal frequency and a frequency at which the input signal is transmitted.

17. The apparatus of claim 15 further comprising a memory element to store a plurality of control values and wherein each control signal of the sequence of control signals is output based upon a respective one of the plurality of control values.

18. The apparatus of claim 15 wherein the sequence of control signals includes an initial control signal indicating an initial tuning signal frequency and wherein control signals output subsequent to the initial control signal are output in an order based on the proximity of their respectively indicated tuning signal frequencies to the initial tuning signal frequency.

19. The apparatus of claim 15 wherein the plurality of frequency bands includes N frequency bands each having a bandwidth substantially equal to a bandwidth BW, and wherein the plurality of frequency bands together encompass a bandwidth substantially equal to N times BW.

20. The apparatus of claim 19 further comprising a passband filter having a center frequency determined by the tuning signal frequency and having a pass bandwidth substantially equal to BW.

21. The apparatus of claim 15 wherein the apparatus is an electronic pager.

22. The apparatus of claim 15 wherein the first frequency control logic includes a programmed processor to output a sequence of input bits corresponding to the sequence of control signals.

23. The apparatus of claim 13 wherein the receive logic includes logic to down-convert the input signal based on the frequency of the tuning signal.

24. The apparatus of claim 15 wherein at least one of the compare logic and first frequency control logic is implemented by a programmed processor.

25. A method comprising:
  receiving a paging signal based on a tuning signal having a frequency within one of a plurality of frequency bands;
  comparing a sequence of values indicated by the paging signal to a predetermined pattern; and
  adjusting the frequency of the tuning signal to be within another of the plurality of frequency bands if the sequence of values does not match the predetermined pattern.

26. The method of claim 25 further comprising repeating the process of receiving of a paging signal, the comparing of a sequence of values and the adjusting of the frequency of the tuning signal until the sequence of values matches the predetermined pattern.

27. The method of claim 26 further comprising adjusting the frequency of the tuning signal by less than half the bandwidth of one of the plurality of frequency bands to correct a frequency difference between the tuning signal frequency and a frequency at which the paging signal is transmitted if the sequence of values match the predetermined pattern.

28. The method of claim 27 wherein adjusting the frequency of the tuning signal by less than half the bandwidth of one of the plurality of frequency bands includes comparing a sum of frequency measurements of the paging signal against an expected sum of frequency measurements.

29. The method of claim 28 wherein the expected sum of frequency measurements is based on expected modulation of the paging signal to generate a sequence of values matching the predetermined pattern.

30. The method of claim 25 wherein adjusting the frequency of the tuning signal includes reading a value indicating the frequency to which the tuning signal is to be adjusted from a table of previously stored values, each value in the table of previously stored values indicating a tuning frequency within a respective one of the plurality of frequency bands.

31. An apparatus comprising:
 means for receiving a paging signal based on a tuning signal having a frequency within one of a plurality of frequency bands;
 means for comparing a sequence of values indicated by the paging signal to a predetermined pattern; and
 means for adjusting the frequency of the tuning signal to be within another of the plurality of frequency bands if the sequence of values does not match the predetermined pattern.

32. The apparatus of claim 31 further comprising means for repeatedly enabling the means for receiving, the means for comparing and the means for adjusting until the sequence of values matches the predetermined pattern.

33. The apparatus of claim 32 further comprising means for adjusting the frequency of the tuning signal by less than half the bandwidth of one of the plurality of frequency bands to correct a frequency difference between the tuning signal frequency and a frequency at which the paging signal is transmitted.

34. The apparatus of claim 33 wherein means for adjusting the frequency of the tuning signal by less than half the bandwidth of one of the plurality of frequency bands includes means for comparing a sum of frequency measurements of the paging signal against an expected sum of frequency measurements.

35. The apparatus of claim 34 wherein the expected sum of frequency measurements is based on expected modulation of the paging signal to generate a sequence of values matching the predetermined pattern.

36. The apparatus of claim 31 wherein the means for adjusting the frequency of the tuning signal includes means for reading a value indicating the frequency to which the tuning signal is to be adjusted from a table of previously stored values, each value in the table of previously stored values indicating a tuning signal frequency within a respective one of the plurality of frequency bands.

37. An apparatus comprising:
 receive logic to receive a paging signal based on a tuning signal having a frequency within one of a plurality of frequency bands;
 compare logic to compare a sequence of values indicated by the paging signal to a predetermined pattern; and
 band select logic to adjust the frequency of the tuning signal to be within another of the plurality of frequency bands if the sequence of values does not match the predetermined pattern.

38. The apparatus of claim 37 further comprising control logic to enable the receive logic, compare logic and band select logic to repeat their respective reception, comparison and adjustment operations until the sequence of values matches the predetermined pattern.

39. An apparatus comprising:
 an oscillator to receive a control signal and to generate a tuning signal having a frequency indicated by the control signal;
 receive logic to receive a paging signal based on the tuning signal to obtain a sequence of values;
 compare logic to compare the sequence of values to a predetermined pattern; and
 first frequency control logic to output a sequence of control signals to the oscillator until the compare logic indicates that the sequence of values matches the predetermined pattern, each control signal of the sequence of control signals indicating a frequency within a respective one of a plurality of frequency bands.

40. The apparatus of claim 39 further comprising second frequency control logic to output an adjust signal that is combined with one control signal of the sequence of control signals to adjust the frequency of the oscillator within one of the plurality of frequency bands to correct a frequency difference between the tuning signal frequency and a frequency at which the paging signal is transmitted.

41. The apparatus of claim 39 further comprising a memory element to store a plurality of control values and wherein each control signal of the sequence of control signals is output based upon a respective one of the plurality of control values.

42. The apparatus of claim 39 wherein the sequence of control signals includes an initial control signal indicating an initial tuning signal frequency and wherein control signals output subsequent to the initial control signal are output in an order based on the proximity of their respectively indicated tuning signal frequencies to the initial tuning signal frequency.

43. The apparatus of claim 39 wherein the plurality of frequency bands includes N frequency bands each having a bandwidth substantially equal to a bandwidth BW, and wherein the plurality of frequency bands together encompass a bandwidth substantially equal to N times BW.

44. The apparatus of claim 43 further comprising a passband filter having a center frequency determined by the tuning signal frequency and having a pass bandwidth substantially equal to BW.

45. The apparatus of claim 39 wherein the apparatus is an electronic pager.

46. The apparatus of claim 39 wherein the first frequency control logic includes a programmed processor to output a sequence of values corresponding to the sequence of control signals.

47. The apparatus of claim 39 wherein the receive logic includes logic to down-convert the paging signal based on the frequency of the tuning signal.

48. The apparatus of claim 39 wherein at least one of the compare logic and first frequency control logic is implemented by a programmed processor.

* * * * *